US008470623B2

(12) United States Patent
Kim et al.

(10) Patent No.: US 8,470,623 B2
(45) Date of Patent: Jun. 25, 2013

(54) THIN FILM DISPLAY PANEL AND METHOD OF MANUFACTURING THE SAME

(75) Inventors: Do-Hyun Kim, Seongnam-si (KR); Kyoung-Jae Chung, Seoul (KR); Seung-Ha Choi, Suwon-si (KR); Dong-Hoon Lee, Seoul (KR); Chang-Oh Jeong, Suwon-si (KR); Suk-Won Jung, Goyang-si (KR)

(73) Assignee: Samsung Display Co., Ltd. (KR)

( * ) Notice: Subject to any disclaimer, the term of this patent is extended or adjusted under 35 U.S.C. 154(b) by 197 days.

(21) Appl. No.: 12/818,047

(22) Filed: Jun. 17, 2010

(65) Prior Publication Data
US 2011/0114940 A1 May 19, 2011

(30) Foreign Application Priority Data

Nov. 16, 2009 (KR) .................. 10-2009-0110404

(51) Int. Cl.
*H01L 21/00* (2006.01)
(52) U.S. Cl.
USPC ............................... 438/34; 438/104; 257/43
(58) Field of Classification Search
USPC ...................... 438/34, 104; 257/43
See application file for complete search history.

(56) References Cited

U.S. PATENT DOCUMENTS

| 5,912,506 | A | * | 6/1999 | Colgan et al. ............ 257/750 |
| 7,772,021 | B2 | * | 8/2010 | Lee et al. ................ 438/30 |
| 2006/0175286 | A1 | * | 8/2006 | Matsushita et al. ........ 216/23 |
| 2007/0152220 | A1 | * | 7/2007 | Kwack ................... 257/59 |
| 2008/0283831 | A1 | * | 11/2008 | Ryu et al. ............... 257/43 |
| 2010/0105163 | A1 | * | 4/2010 | Ito et al. ................ 438/104 |

* cited by examiner

*Primary Examiner* — Stephen W Smoot
*Assistant Examiner* — Vicki B Booker
(74) *Attorney, Agent, or Firm* — Innovation Counsel LLP

(57) ABSTRACT

A thin film transistor array panel includes: a substrate; a gate line disposed on the substrate and including a gate electrode; a gate insulating layer disposed on the gate line; an semiconductive oxide layer disposed on the gate insulating layer; a data line disposed on the semiconductive oxide layer and including a source electrode; a drain electrode facing the source electrode on the semiconductive oxide layer; and a passivation layer disposed on the data line. The semiconductive oxide layer is patterned with chlorine (Cl) containing gas which alters relative atomic concentrations of primary semiconductive characteristic-providing elements of the semiconductive oxide layer at least at a portion where a transistor channel region is defined.

20 Claims, 15 Drawing Sheets

THIN FILM DISPLAY PANEL AND METHOD OF MANUFACTURING THE SAME

CROSS-REFERENCE TO RELATED APPLICATION

This application claims priority to and the benefit of Korean Patent Application No. 10-2009-0110404 filed in the Korean Intellectual Property Office on Nov. 16, 2009, the entire contents of which application are incorporated herein by reference.

BACKGROUND (a) Field of Disclosure

A thin film transistor array panel and a manufacturing method thereof are provided.

(b) Description of Related Technology

In general, a flat panel display such as a liquid crystal display (LCD), an organic light emitting diode display (OLED display), and an electrophoretic display includes a pair of opposed field generating electrodes and one or more electro-optical active layers that are interposed therebetween. The LCD includes a liquid crystal layer as the electro-optical active layer, while the OLED display includes an organic light emitting layer as the electro-optical active layer. One of field generating electrodes of a given opposed pair is generally connected to an electronically controlled switching element to thereby selectively receive an image defining electrical signal when addressed. The electro-optical active layer converts the received electrical signal into an optical signal, thereby causing display of a desired image portion.

The flat panel display may include a display panel having a plurality of thin film transistors (TFTs) integrally formed thereon. This panel is often referred to as the TFT array panel. Typically, the thin film transistor (TFT) array panel is patterned via photolithography during mass production to have multiple electrodes and semiconductive regions of various kinds. A plurality of masks and corresponding patterning processes are generally used in the mass production manufacturing process.

On the other hand, the semiconductive material used to form each TFT is an important factor in determining the operating characteristics of the TFT array. The commonly used semiconductive material is made of amorphous silicon. However, a disadvantage of amorphous silicon (Si-(a)) is that the charge mobility thereof is relatively low (as compared for example to that of single crystalline or polycrystalline silicon (Si-(p/a)). To alleviate this shortcoming, recently, mass production fabrication of thin film transistors using a semiconductive oxide and having relatively high charge mobility and a relatively high ON/OFF ratio of conducted current ($I_{on}/I_{leakage}$)—as compared with the conventional amorphous silicon transistor—has been researched.

The above information disclosed in this Background section is only for enhancement of understanding of the here disclosed technology and therefore it may contain information that does not form the prior art that is already known to persons of ordinary skill in the pertinent art.

SUMMARY

A thin film transistor array panel according to an exemplary embodiment of the present disclosure includes: a substrate; a gate line disposed on the substrate and including a gate electrode; a gate insulating layer disposed on the gate line; an semiconductive oxide layer disposed on the gate insulating layer; a data line disposed on the semiconductive oxide layer and including a source electrode; a drain electrode facing the source electrode on the semiconductive oxide layer; and a passivation layer disposed on the data line. The semiconductive oxide layer is one treated with a $Cl_2/O_2$ dry etch recipe such that the semiconductive oxide layer thereafter includes trace amounts of Cl. However, of more pertinence, the $Cl_2/O_2$ dry etch recipe is seen to create a variation in compositional elements of the semiconductive oxide layer that give the latter layer good consistency of semiconductive characteristics.

The semiconductive oxide layer may include at least one element selected from the group consisting of gallium (Ga), hafnium (Hf), tin (Sn), zinc (Zn), and indium (In).

The semiconductive oxide layer may include at least two regions having respective different atom content ratios.

A content ratio of hafnium or gallium in a channel defining region of the semiconductive oxide (near an overlying data line) may be higher than an average content ratio of hafnium or gallium in the semiconductive oxide layer taken as a whole.

A content ratio of tin, zinc, or indium in a region of the semiconductive oxide near the data line may be lower than an average content ratio of tin, zinc, or indium in the semiconductive oxide layer taken as a whole.

The data line, the source electrode, and the drain electrode may include at least one of Mo, Al, Cu, Ti, Mn, and respective alloys thereof.

The semiconductive oxide layer may include a first portion (channel portion) and a second portion, where the first portion is disposed between the source electrode and the drain electrode, the second portion is overlapped by the source electrode or the drain electrode, and a thickness of the first portion may be substantially smaller than a thickness of the second portion.

The difference of the thickness of the first portion and the thickness of the second portion may be less than about 150 angstroms.

The source electrode and the drain electrode may have respective planar shapes that are substantially the same as respectively overlaid portions of the semiconductive oxide layer except for the area of the first portion where the channel is defined.

The data line, the source electrode, and the drain electrode are contacted with the semiconductive oxide.

The data line, the source electrode, and the drain electrode may each have a double-layered structure, a triple-layered structure or another multi-layered structure.

The gate line and the gate electrode may have a double-layered structure.

The gate insulating layer may have a double-layered structure.

The passivation layer may have a double-layered structure.

A manufacturing method of a thin film transistor array panel according to an exemplary embodiment of the present disclosure includes: forming a gate line including a gate electrode on a substrate; sequentially forming a gate insulating layer, an semiconductive oxide layer, a data line metal layer, and a photosensitive film on the gate line; patterning the photosensitive film; and patterning the semiconductive oxide layer and the data line metal layer to form a source electrode and a drain electrode that are separated from each other, wherein the semiconductive oxide layer includes a first portion (channel portion) disposed between the source electrode and the drain electrode, and the first portion is dry-etched by a Cl-containing gas.

The first portion may be dry-etched by a combination of a Cl-containing and oxygen-containing gas.

The data line metal layer may include at least one of Mo, Al, Cu, Ti, Mn, and respective alloys thereof.

The semiconductive oxide layer may include a second portion overlapping the source electrode and the drain electrode, and the thickness of the first portion may be equal to or thinner than the thickness of the second portion.

The difference between the thickness of the first portion and the thickness of the second portion may be less than 150 angstroms.

The data line metal layer may be dry-etched by a F-containing gas.

The data line metal layer may be contacted with the semiconductive oxide layer.

The data line metal layer may have a double-layered structure or a triple-layered structure.

The gate line and the gate electrode may have the double-layered structure.

The exemplary embodiments according to the present disclosure provide a thin film transistor having excellent substantially consistent semiconductive characteristics irrespective of different local granular structures that may be found in the Cl-treated semiconductive oxide layer.

DETAILED DESCRIPTION OF THE EMBODIMENTS

Figure 1:
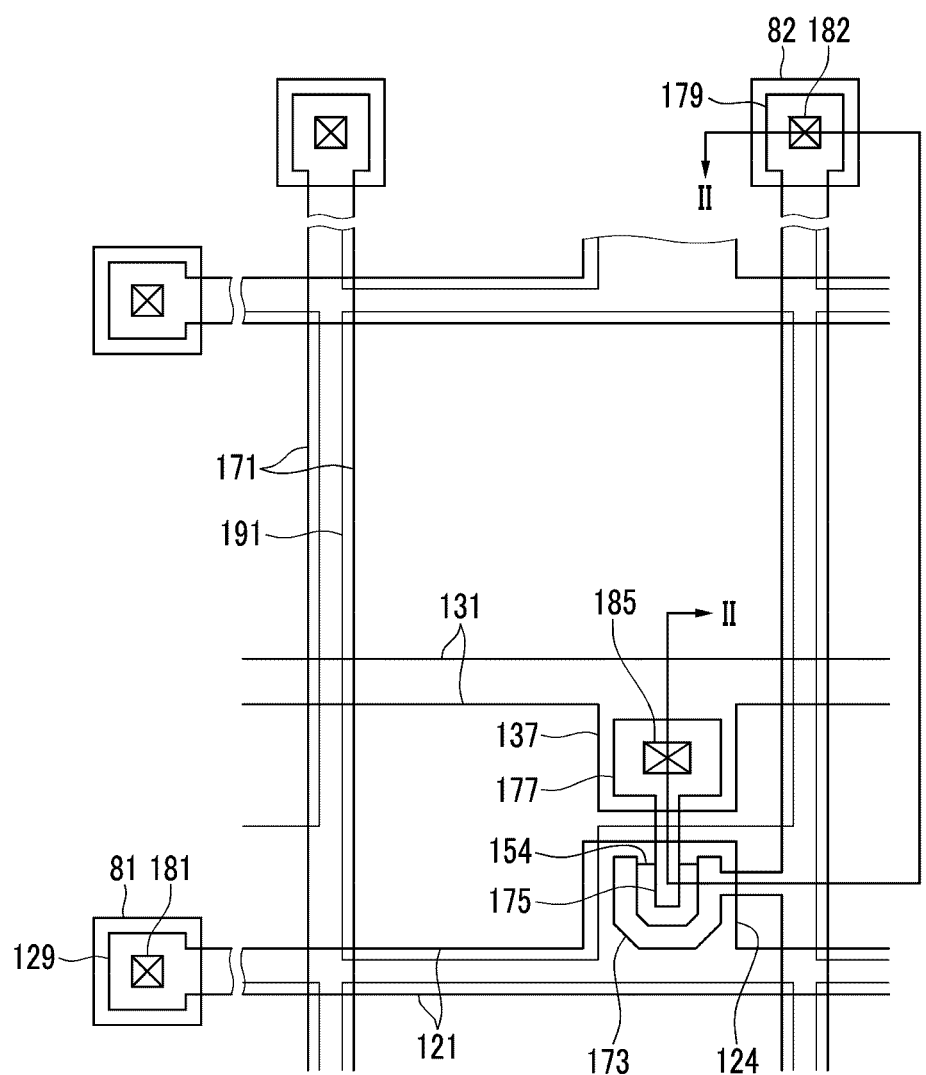
FIG. 1 is a layout view of a thin film transistor array panel according to an exemplary embodiment in accordance with the present disclosure.

The present disclosure will be described more fully hereinafter with reference to the accompanying drawings, in which exemplary embodiments in accordance with the present teachings are shown. As those skilled in the pertinent art would realize after appreciation of the present disclosure, the described embodiments may be modified in various different ways, all without departing from the spirit or scope of the present teachings. In the drawings, irrelevant portions may be omitted to thereby more clearly describe the present teachings, and like reference numerals generally designate like elements throughout the specification. Furthermore, detailed descriptions are not given to well-known aspects of the pertinent art.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "under" another element, it can be directly under the other element or intervening elements may also be present. On the contrary, when an element is referred to as being "directly under" another element, there are no intervening elements present.

Now, a thin film transistor array panel according to an exemplary embodiment of the present disclosure will be described with reference to FIG. 1 and FIG. 2. Hereafter, a thin film transistor (TFT) array panel as may be used in a liquid crystal display (LCD) will be described as an example. However, the here disclosed thin film transistor array technology may also be applied to other types of flat panel displays such as organic light emitting devices (OLED based or like displays).

Figure 2:
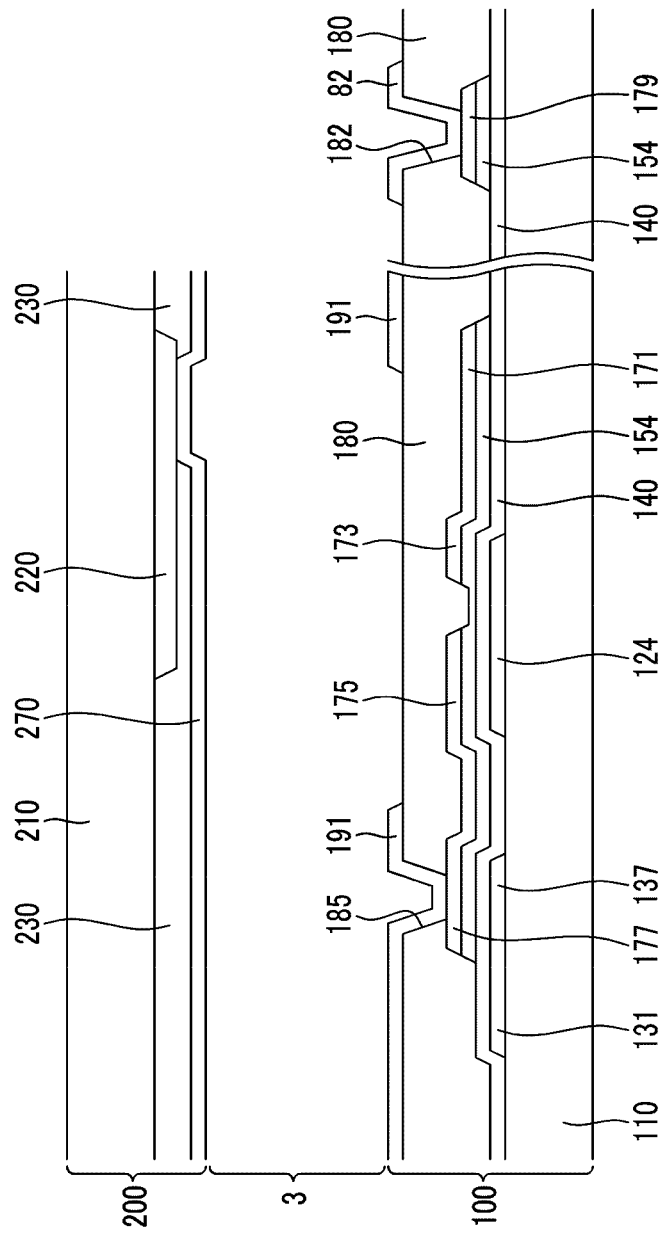
FIG. 2 is a cross-sectional view of the thin film transistor array panel shown in FIG. 1 taken along the line II-II.

FIG. 1 is a layout view of a thin film transistor array panel according to an exemplary embodiment of the present disclosure, and FIG. 2 is a cross-sectional view of the thin film transistor array panel shown in FIG. 1 taken along the line II-II.

In FIG. 1, a repeating pixel unit structure that tiles a display area (DA) of a display device is shown. The pixel unit structure generally includes a corresponding portion of a gate line 121, a corresponding gate electrode 124, a corresponding portion of a storage electrode line 131, and a corresponding storage electrode 137 where the repeated pixel unit structure is formed on a transparent insulating substrate 110 such as a glass or a plastic by means of photolithography for example. Each gate line 121 is structured to transmit a corresponding gate signal to TFTs provided there along. Each gate line 121 generally extends in an approximate row direction, and each may include a plurality of gate electrodes 124 integrally protruding therefrom (into corresponding pixel unit structures, where the protrusion direction is upward in FIG. 1. Each gate line 121 may include an end portion 129 by way of which electrical contact is made to the gate line 121 from other external circuit components. However, the end portion 129 of the gate line may be omitted.

The storage electrode line 131 may form part of a storage capacitance structure and generally it receives a predetermined storage electrode voltage and generally it extends substantially parallel to the gate lines 121. The storage electrode line 131 may include storage electrodes 137 integrally protruding therefrom for example each with an almost quadrangular shape in its respective pixel unit structure. Here, the shape and the arrangement of the storage electrode line 131 and the storage electrode 137 may be variously changed. Further, the storage electrode line 131 and the storage electrode 137 may be omitted.

Each gate line 121 (and optional end portion 129) and each storage electrode line 131 may include a generally opaque metal layer such as an aluminum-based metal layer composed of aluminum (Al) or aluminum alloys, or a silver-based metal layer composed of silver (Ag) or silver alloys, or a copper-based metal layer composed of copper (Cu) or copper alloys such as CuMn, or a molybdenum-based metal layer composed of molybdenum (Mo) or molybdenum alloys, chromium (Cr), tantalum (Ta), titanium (Ti), etc. Also, each gate line 121 (and 129) and each storage electrode line 131 may alternatively or additionally include a transparent conductive material layer such as one composed of ITO (indium tin oxide), or IZO (indium zinc oxide), or AZO (aluminum doped ZnO). In one embodiment, each gate line 121 (and 129) and each storage electrode line 131 has a multi-layered structure that includes at least two conductive films (not shown) having different physical characteristics, for example the opaque metal layer and the transparent conductive material layer. In an alternate embodiment, each gate line 121 (and 129) and each storage electrode line 131 has a double-layered structure that includes titanium as a lower metal layer and copper as an upper metal layer.

A gate insulating layer 140 is formed on the gate lines 121 and the storage electrode lines 131. The gate insulating layer 140 may include a silicon nitride (SiNx), a silicon oxide (SiOx), a silicon oxynitride (SiOxNy), and/or an organic insulating material. The gate insulating layer 140 may have a multilayered structure including at least two insulating layers (not shown). For example, an upper layer of the gate insulating layer 140 may include SiOx and a lower layer may include SiNx, or the upper layer may include SiOx and the lower layer may include SiON. When the gate insulating layer 140 is structured to include a SiOx upper layer and it is directly contacted with a next-described, channel structure 154 composed of a semiconductive oxide; degradation of the channel region 154 may be prevented as shall be explained below.

Rather than using a conventional Si-(a) material of uniform thickness for forming the channel region 154 of the TFT (the one having gate 124), a semiconductive oxide material layer 154 of varying thickness is formed on the gate insulating layer 140. The semiconductive oxide material of layer 154 may be an oxide of at least one of zinc (Zn), indium (In), gallium (Ga), tin (Sn), and hafnium (Hf). For example, the semiconductive oxide layer 154 may include GIZO (wherein, G is gallium, I is indium, Z is zinc, O is oxygen) or XIZO (wherein, X is hafnium, I is indium, Z is zinc, O is oxygen) and wherein the by-atom proportionalities of the elements in the GIZO or XIZO composition may vary as further disclosed below.

Atoms may be differently positioned and/or concentrated at the surface of the semiconductive oxide layer 154 and in the inner part thereof. In one embodiment, the process of patterning the channel region portion of the semiconductive oxide layer 154 includes a dry etching step that uses a $Cl_2/O_2$ recipe. The $Cl_2/O_2$ dry etch is executed such that an advantageous concentration of Cl atoms is incorporated into the semiconductive oxide layer 154. For example, referring briefly to FIG. 14, the Cl atoms may be incorporated within the GIZO or XIZO composition to have an atomic concentration range of about 0.01 to about 5% as measured by atomic concentration analysis taken for the entire semiconductive oxide layer 154.

The semiconductive oxide layer 154 may include at least two regions having different atom content ratios. For example, a content ratio of hafnium (X) or gallium (G) relative to overall content and in a region of the semiconductive oxide layer 154 close to an overlying data line 171 may be made higher than an average content ratio of hafnium or gallium as measured over all parts of the semiconductive oxide layer 154 (e.g., by a same sputter and analyze technique). Also, a content ratio of tin, zinc, or indium in a region of the semiconductive oxide layer 154 close to the data line 171 may be made relatively lower than the average content ratio of tin, zinc, or indium as measured over all parts of the semiconductive oxide layer 154. When executing the dry etching of the semiconductive oxide layer 154 using the $Cl_2/O_2$ recipe, some of the tin, zinc, or indium atoms in the semiconductive oxide layer 154 is believed to become combined with the Cl atoms of the etch plasma and the resultant etch reaction byproducts may then be volatilized in the form of gaseous SnClx, InClx, or ZnClx. On the other hand, most of the hafnium or gallium atoms in the semiconductive oxide layer 154 may not be volatilized upon exposure to the $Cl_2/O_2$ etch recipe due to what is believed to be a strong combination force with an adjoining oxygen atom. Accordingly, the relative content ratio of tin, zinc, or indium close to the upper surface of the semiconductive oxide layer 154, which upper surface is exposed to the $Cl_2/O_2$ etch recipe; may decrease, and the relative content ratio of hafnium or gallium may thereby relatively increase at the etch treated surface of the patterned semiconductive oxide layer 154. When the content ratio of hafnium or gallium increases near the upper surface of the semiconductive oxide layer 154, where that upper surface makes contact with the source (173) and drain (175) electrodes, the reliability of the thin film transistor may be improved.

More specifically, material concentration analysis was performed with aid of sputtering to thereby determine atomic concentration of various elements in the GIZO or XIZO compositions as a function of depth below the upper surface where sputter time (in seconds) corresponds to depth. Referring to the sputter time based measurements shown in the graphs of FIG. 13 to FIG. 15, it may be seen that near the surface of the semiconductive oxide layer 154, the content ratio of X in FIG. 14 is larger than the content ratio of the same X component (hafnium) in FIG. 13 and FIG. 15, and also that the content ratio of In or Zn in FIG. 14 is smaller than the content ratio of In or Zn in FIG. 13 and FIG. 15.

In accordance with one aspect of the present disclosure, the channel portion of the semiconductive oxide layer 154 may be over-etched in a depth direction using the $Cl_2/O_2$ dry etch recipe. For example, the over-etched thickness in the channel portion of the semiconductive oxide layer 154 may be in the range of about 50-150 angstroms. However, in an alternate embodiment, the channel portion of the semiconductive oxide layer 154 may not be so over-etched. It may be preferable that the channel portion of the semiconductive oxide layer 154 has at least a predetermined thickness to maintain a desired current carrying capacity and/or other characteristics of the thin film transistor. For example, in one embodiment, the channel of the semiconductive oxide layer 154 has a thickness of more than about 300 angstroms.

The channel portion of the semiconductive oxide layer 154 may be formed by a dry etching (e.g., reactive ion etch) process using $Cl_2/O_2$ as part of the etch recipe. That is, in one embodiment, when selectively removing material from an overlying metal layer (171-173-175-177) positioned on a region where the channel portion of the semiconductive oxide layer 154 is to be formed, the dry etching process using $Cl_2/O_2$ may be applied, and in this case, the characteristic of the semiconductive oxide that is intentionally exposed to the metal etch plasma may be improved.

Figure 14:
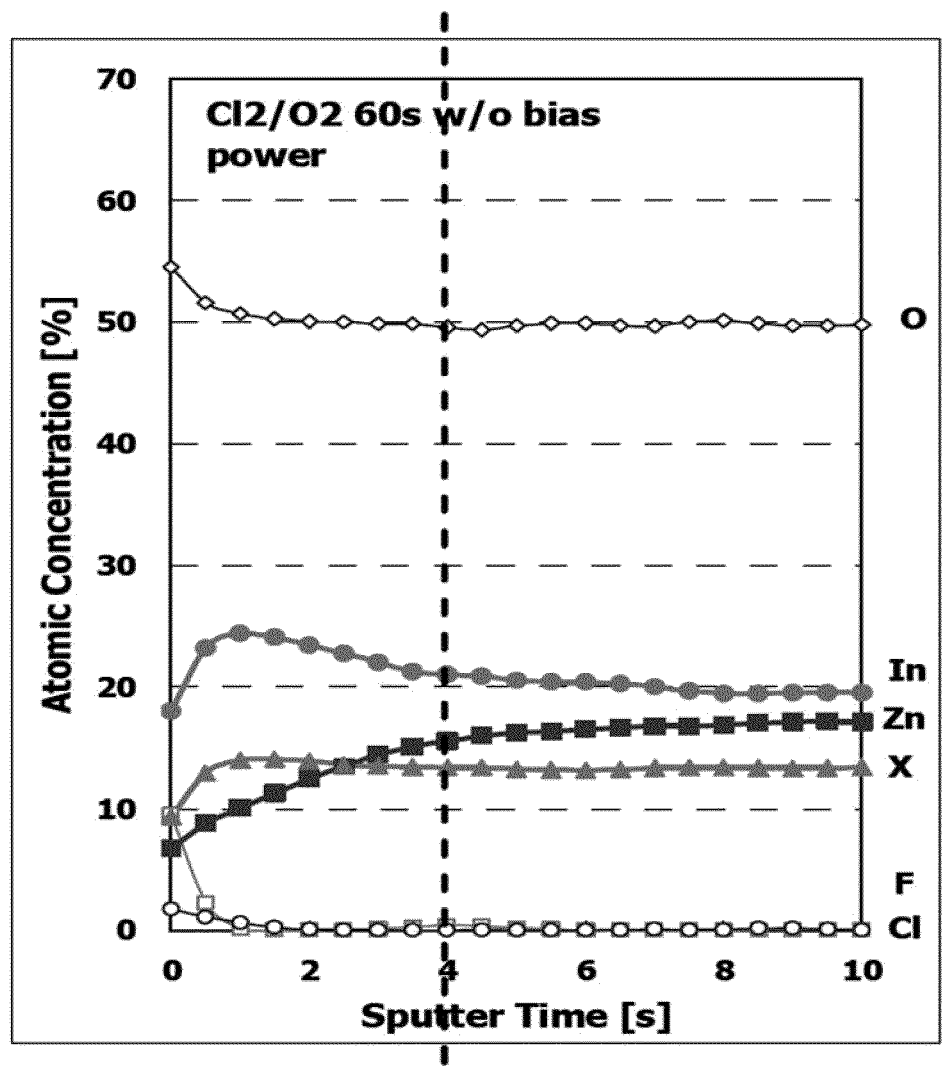
Figure 15:
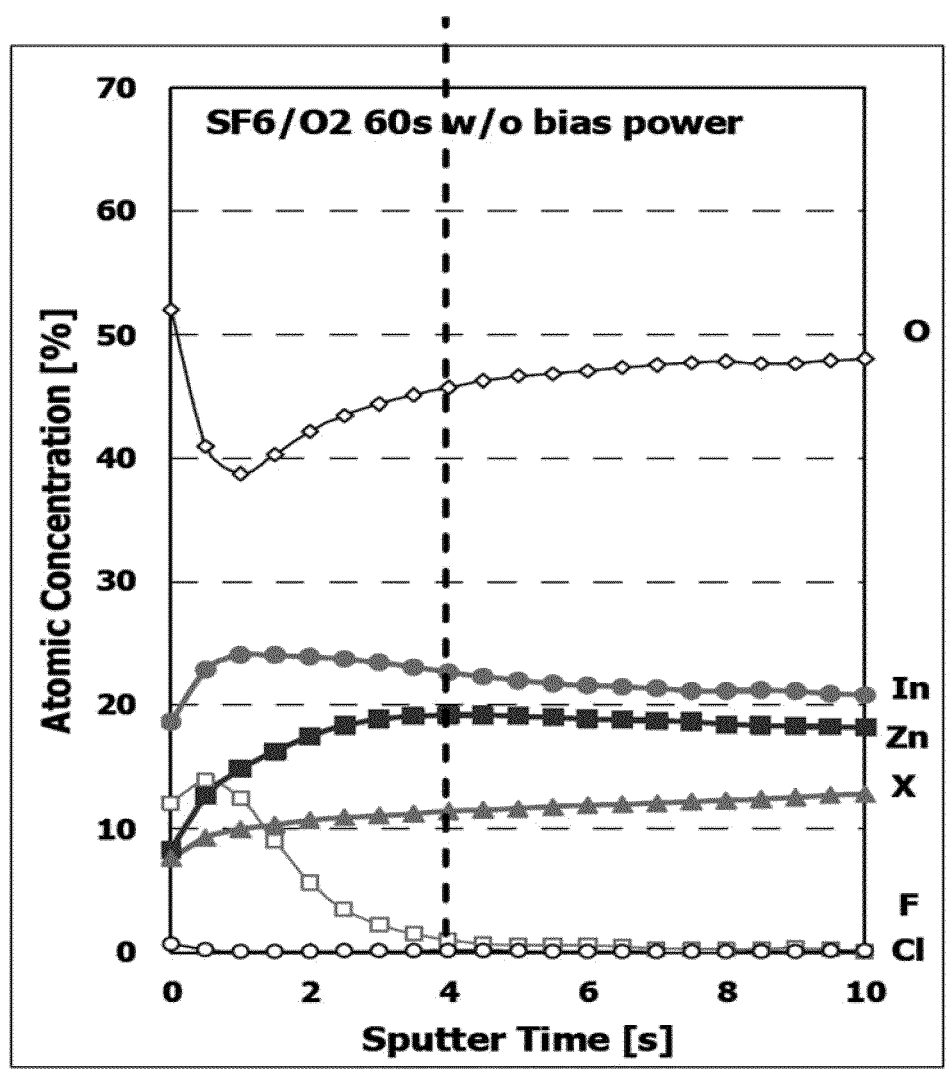

Alternatively or additionally, when portions of the metal layer are selectively removed using a $SF_6/O_2$ dry etch recipe to thereby form the channel portion of the semiconductive oxide layer 154, a portion of F atoms are believed to reactively combine with some of the surface oxygen atoms of the semiconductive oxide layer such that the concentration of the oxygen atoms may be decreased in the so-treated channel portion of the semiconductive oxide layer, and in this case, due to the partial loss of the oxygen atoms in the GIZO or XIZO composition the semiconductive characteristics of the semiconductive oxide may be degraded. FIG. 15 shows sputter analysis results when a $SF_6/O_2$ dry etch recipe is used to over-etch into the channel portion of the semiconductive oxide layer 154. It may be confirmed from FIGS. 15 and 14 that the surface concentration of oxygen atoms in FIG. 15 is generally less than the surface concentration of the oxygen atoms in FIG. 14. However, even in the case where $SF_6/O_2$ is used to begin over-etching into and thus beginning to form the channel portion of the semiconductive oxide layer 154, if the channel is thereafter treated using the $Cl_2/O_2$ recipe after having used $SF_6/O_2$ for a beginning portion of the metal etch process, the semiconductive characteristics of the semiconductive oxide layer may nonetheless be improved as compared to case where the $SF_6/O_2$ is not followed up with post-treatment by a $Cl_2/O_2$ recipe. Although the discussion here focused on the case where only the channel portion of the semiconductive oxide layer 154 is selectively over etched into, when the channel portion is treated using $Cl_2/O_2$, the channel may be over-etched, or not and the $Cl_2/O_2$, treatment may instead be applied to the whole upper surface of layer 154.

After the semiconductive oxide layer 154 is deposited, the conductive material(s) for forming the data line 171 and a drain electrode 175 are positioned on the semiconductive oxide layer 154. Ohmic contact material layers doped with impurities may or may not be formed between the semiconductive oxide layer 154 and the material layer(s) of the data line 171. The semiconductive oxide layer 154 may be pre-patterned before the conductive material(s) for forming the data line 171, etc. are deposited and then the semiconductive oxide layer 154 may be thereafter further patterned by the over-etching action of the $Cl_2/O_2$, treatment process. The data line 171 is used to transmit image data voltages to corresponding pixel unit structures and it extends in an approximate column direction, thereby intersecting under or over the gate lines 121. The data line 171 may include an end portion 179, and may have one or more source electrodes 173 integrally protruding therefrom as a curved "U" shape overlapping the gate electrode 124. Also, the shape of the source electrode 173 may be variously changed.

The drain electrode 175 is etched so as to be separated from the data line 171, and includes a narrow portion and a wider contact/storage portion 177. The narrow portion includes an end portion enclosed by the source electrode 173, and the wider contact/storage portion 177 is almost quadrangular in one embodiment and overlaps the storage electrode 137. The wide portion 177 of the drain electrode 175 may have almost the same area as the storage electrode 137.

The data line 171 (and 179), the source electrode 173, and the drain electrode 175 (and 177) may include a not normally transparent metal layer such as one composed of an aluminum-based metal of aluminum (Al) or aluminum alloys, such as one composed of a silver-based metal of silver (Ag) or silver alloys, such as one composed of a copper-based metal of copper (Cu) or copper alloys such as CuMn, such as one composed of a molybdenum-based metal of molybdenum (Mo) or molybdenum alloys, such as one composed of chromium (Cr), tantalum (Ta), titanium (Ti), etc. For example, the molybdenum alloy may be Mo—Nb or Mo—Ti. Also, the data line 171 (and 179) and the drain electrode 175 (and 177) may include the transparent conductive material layer such as one composed of ITO, IZO, and AZO. The data line 171 (and 179), the source electrode 173, and the drain electrode 175 (and 177) may have a multi-layered structure including two conductive films (not shown) having different physical characteristics. Examples of such multilayer structures include Mo/Al/Mo, Mo/Al, Mo/Cu, CuMn/Cu, and Ti/Cu. When executing the dry etching process using $SF_6/O_2$, $Cl_2/O_2$, etch recipes or mixtures thereof, a thickness of the data line 171 (and 179), the source electrode 173, and the drain electrode 175 (and 177) include Mo, may be uniformly maintained.

On the other hand, the gate electrode 124, the source electrode 173, and the drain electrode 175 define a thin film transistor (TFT) along with the semiconductive oxide layer 154, and the channel portion of the thin film transistor is formed in the semiconductive oxide layer 154 to be disposed between the source electrode 173 and the drain electrode 175. The drain electrode 175 is connected to the pixel electrode 191 for thereby applying a driving voltage to the pixel-electrode.

The semiconductive oxide layer 154, and the data line 171 (and 179) and the drain electrode 175 (and 177) may have substantially the same planar shapes. However, the data line 171 (and 179), the source electrode 173, and the drain electrode 175 (and 177) do not cover the channel portion of the thin film transistor. The three layers including the semiconductive oxide layer 154, and the data line 171 (and 179) and the drain electrode 177, may be sequentially deposited blanket-wise on the whole surface and may thereafter be patterned using one photolithography mask. However, in an alternate embodiment, just the semiconductive oxide layer 154 and the data line 171 (and 179) may be respectively patterned by using one separate mask.

A passivation layer 180 including for example a silicon nitride (SiNx), a silicon oxide (SiOx), or a SiON composition is formed on the data line 171 (and 179) and the drain electrode 175. The passivation layer 180 may alternatively or additionally include an organic insulating material. The passivation layer 180 may be multilayered. For example, a lower layer of the passivation layer 180 may include SiOx and an upper layer may include SiNx, or the lower layer may include SiOx and the upper layer may include SiON. When the passivation layer 180 contacted with the semiconductive oxide layer 154 includes an oxide, degradation of the channel portion may be prevented. The passivation layer 180 is patterned to include a contact hole 185 exposing the drain electrode 177, and a contact hole 182 exposing the end portion 179 of the data line. The passivation layer 180 may include a contact hole 181 exposing the end portion 129 of the gate line 121. The pixel electrode 191 is connected to the drain electrode 177 through the contact hole 185. The end portion 179 of the data line is connected to a connecting member 82 through the contact hole 182.

A transparent conductive material (e.g., ITO, IZO) is then deposited and patterned to define the pixel electrode 191 as being disposed on the passivation layer 180. The pixel electrode 191 may consist of a transparent conductive oxide such as ITO and IZO. Connecting members 81 and 82 are disposed on the end portions 129 and 179 of the gate line and the data line. The connecting member 81 and 82 may include the same material as the pixel electrode 191.

A liquid crystal material layer 3 is next provided for positioning between the first display panel 100 including the thin film transistors and a second display panel 200 facing but spaced apart from the first display panel 100. The liquid crystal layer 3 may have positive or negative dielectric anisotropy, and the liquid crystal molecules of the liquid crystal layer 3 are aligned such that the long axis thereof may be arranged parallel or perpendicular to the surface of first and second display panels 100 and 200 when an electric field is not applied.

At least one alignment layer (not shown) may be formed on an inner surface of the first and second display panels 100 and 200, and may be a vertical or horizontal alignment layer. A polarizer (not shown) may be provided on the outer surface of the first and second display panels 100 and 200.

A light blocking member 220 is positioned on a second substrate 210. The light blocking member 220 is referred to as a black matrix, and prevents light leakage.

A color filter 230 is positioned on the light blocking member 220. The color filter 230 may have a belt shape between adjacent data lines 171. The color filter 230 may include pigments representing red, green, or blue, and may be formed from a photosensitive organic material.

A common electrode 270 is formed on the color filter 230. The common electrode 270 may include the transparent conductive oxide such as ITO and IZO.

The pixel electrode 191 is connected to the drain electrode 175 of the thin film transistor through the contact hole 185, thereby receiving the data voltage from the drain electrode 175. The pixel electrode 191 to which the data voltage is applied generates an electric field extending to the counter-facing portion of the common electrode 270 of the second display panel 200, thereby determining the orientation of liquid crystal molecules of the liquid crystal layer 3 between the electrodes 191 and 270. The luminance of light that passes through the liquid crystal layers is changed according to the orientation of the liquid crystal molecules.

The pixel electrode 191 and the common electrode 270 may be seen as constituting a liquid crystal capacitor that maintains a voltage applied thereto even after the thin film transistor is turned off.

The pixel electrodes 191 and the drain electrode 175 connected thereto overlap the storage electrode 137 and the storage electrode line 131 thereby forming a storage capacitor.

Next, a manufacturing method of a thin film transistor array panel according to an exemplary embodiment of the present disclosure will be described with reference to FIG. 3 to FIG. 6. However, overlapping description with that of the thin film transistor array panel shown in FIG. 1 to FIG. 2 is omitted.

FIG. 3 to FIG. 6 are cross-sectional view showing a portion of a manufacturing method of a thin film transistor array panel according to an exemplary embodiment of the present disclosure.

In a first set of steps, a respective one or more material layers for forming the gate line 121 (and 129), the gate electrode 124, the storage electrode line 131, and the storage electrode 137 are deposited on a transparent substrate 110 and patterned.

Figure 3:
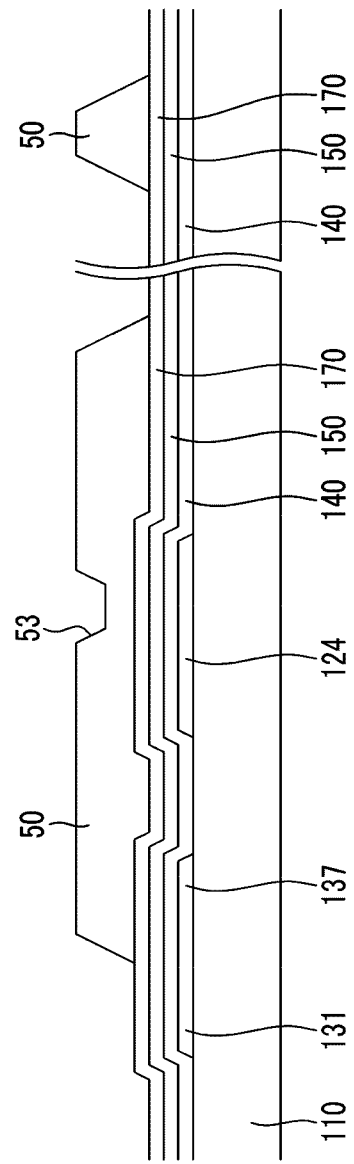
FIG. 3 to FIG. 6 are cross-sectional views showing a portion of a manufacturing method of a thin film transistor array panel according to an exemplary embodiment of the present disclosure.

As shown in FIG. 3, next, respective material layers for forming the gate insulating layer 140, the semiconductive oxide layer 150, and the data line metal layer 170 are sequentially deposited blanket wise on the whole surface of the substrate 110 including over the already patterned gate line 121 and the storage electrode line 131.

A photosensitive film (photoresist) 50 is coated on the data line metal layer 170 and patterned through a photo-process using a mask. The photosensitive film 50 is formed to have different thicknesses and/or slopes depending on positions, and this includes the illustrated groove 53. The groove 53 is a portion corresponding to where the channel portion of the thin film transistor will be formed.

There are many methods available for forming the difference thicknesses according to location of the photosensitive film. One example includes forming a photomask with a translucent area as well as a light transmitting area and a light blocking area. The translucent area is provided with use of a thin slits pattern or a lattice pattern, or as a thin film having intermediate transmittance and/or thickness as compared to the light blocking area. In the case of utilizing the slit pattern, it is preferable that the slit width or the space between the slits is smaller than the resolution of exposure equipment used in the photolithography process. Another example of the groove forming method includes using a reflowable photosensitive film. That is, the method forms a thin portion by making a photosensitive film flow into a region where the photosensitive film is not present after forming the reflowable photosensitive film with a general exposure mask having only a light transmitting area and a light blocking area.

Figure 4:
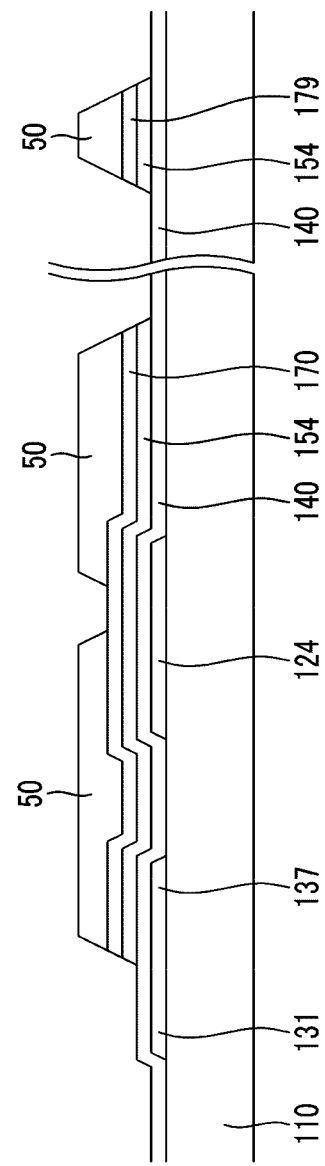

As shown in FIG. 4, the semiconductor layer 150 and the data line metal layer 170 are simultaneously etched to a first level by using a corresponding first selective etching process to form the partially patterned semiconductive oxide layer 154 and the partially patterned data line layer 170 (which later becomes 171 and 179). For example, a wet etching process using an appropriate etchant may be applied. The planar shapes of the semiconductive oxide layer 154 and the data line 171 and 179 may be substantially the same.

Next, the photosensitive film 50 is planarized for example with a CMP or etch back process to thereby provide the whole photosensitive film 50 with uniformly flat top surface. Here, the bottom portion of the groove 53 in the photosensitive film 50 is removed over the portion corresponding to the channel region of the thin film transistor to thereby expose the data line metal layer 170.

Figure 5:
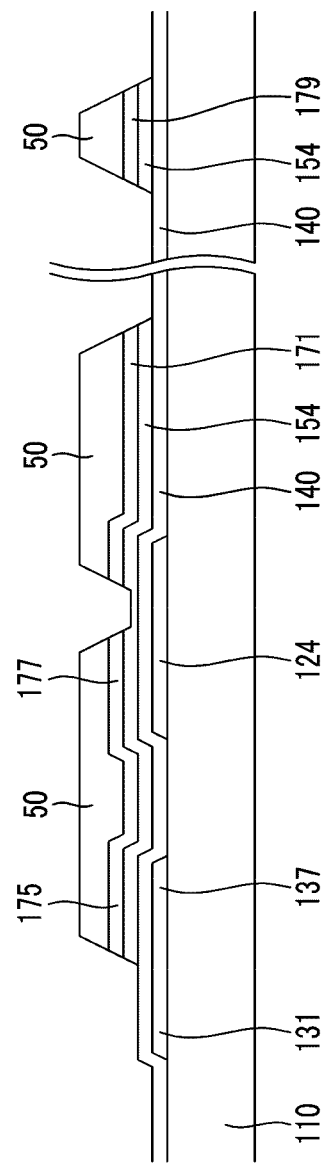

As shown in FIG. 5, the etched-down groove 53 is used to selectively etch through the data line metal layer 170 in the region corresponding to the channel of the thin film transistor using a metal etching process to thus form the source electrode 173 and the spaced apart drain electrode 175. During this process, a portion of the semiconductive oxide layer 154 is removed so as to form the thinned down channel region. That is, the channel portion of the semiconductive oxide layer 154 is partially removed so as to create a semiconductive oxide region that is more easily controlled by an electrical potential applied to the gate 124. However, in an alternate embodiment, the channel portion of the semiconductive oxide layer 154 may be left as is and not partially removed.

As the etching process for etching partially into the semiconductive oxide layer 154 and thus defining its channel portion, a dry etching process (e.g., RIE) first using $SF_6/O_2$ and then $Cl_2/O_2$ may be used, or the $Cl_2/O_2$ etch recipe alone may be used. Here, it may be preferable that the beginning part of the etch through the metal uses the $SF_6/O_2$ etch recipe and then the finishing of the dry etching process uses the $Cl_2/O_2$ etch recipe so that the semiconductive characteristic of the thin film transistor may be appropriately controlled. In one embodiment, the $Cl_2/O_2$ etch recipe is applied uniformly to the entire, and there alternatively exposed surface of the semiconductive oxide layer 154 so that same semiconductive characteristics are maintained throughout the entire surface of the semiconductive oxide layer. In terms of examples, the dry etching process may be executed by only using $Cl_2/O_2$ to form the channel. $SF_6/O_2$ or a mixture of $SF_6/O_2$ and $Cl_2/O_2$ may be firstly used and $Cl_2/O_2$ may be used to finish the dry etching process. Also, before the dry etching process using $Cl_2/O_2$, the dry etching process may be executed in two steps. For example, the first etching step using $SF_6/O_2$ and $Cl_2/O_2$ may be executed and then the second etching step only using $SF_6/O_2$ may be executed.

When using the $Cl_2/O_2$ etch recipe after having used the $SF_6/O_2$, etch recipe; undesired F atoms that may have become trapped in upper surface of the semiconductive oxide layer 154 may be removed by subsequently etching the semiconductive oxide layer 154 with the $Cl_2/O_2$ etch recipe and in this case, the desired semiconductive characteristic of the thin film transistor may be uniformly maintained throughout the surface of the channel portion of the semiconductive layer.

When etching the channel portion of the semiconductive oxide layer 154, the etching may be executed using one continuous step in a same process chamber using the $SF_6/O_2$ and $Cl_2/O_2$ etch recipes in sequence or using a mixture thereof before the over-etching step. Alternatively, the dry etching process may be divided into at least two steps and executed as such before or after the generation of the over-etching. For example, in one embodiment, the first etching step using $SF_6/O_2$ and $Cl_2/O_2$ may be executed and then after the grooved area is covered with a temporary protective material a second etching step only using $SF_6/O_2$ may be executed to thereby more quickly etch through the metal layers at regions where such further etching is desired. In the over-etching step, the semiconductive oxide layer 154 may be etched by one continuous step using $Cl_2/O_2$. Also, the over-etching step may be divided into at least two steps to etch the semiconductive oxide layer 154. For example, the first over-etching step using $SF_6/O_2$, $Cl_2/O_2$, or mixtures thereof may be executed, and then a second over-etching step using only the $Cl_2/O_2$ etch recipe may be executed. Also, the etching step before the over-etching and the over-etching step may be executed by the dry etching as the continuous step using only the $Cl_2/O_2$ etch recipe, however the concentrations of chlorine and oxygen atoms in the plasma as well as gas flow rates may be varied during the $Cl_2/O_2$ only etch step. Further, the dry etching may be executed as one continuous step using only $SF_6/O_2$ from the etching step before the first over-etching to the first over-etching step, and then the second over-etching using only $Cl_2/O_2$ may be executed. For example, the etching step before the first over-etching and the first over-etching step is executed as one continuous step using only $SF_6/O_2$ for about 140 seconds. Next, the second over-etching using essentially only $Cl_2/O_2$ is executed for about 30 seconds, and the resulting XIZO channel region is thus etched to have a thickness of about 50 angstroms. Here, the thickness of the remaining, non-channel semiconductive oxide layer is in the range of about 300-350 angstroms.

The etching process may be appropriately designed using the ratio between the etching speed of the data line metal layer 170 and the etching speed of the semiconductor layer 150 when using a combination of $SF_6/O_2$ and $Cl_2/O_2$. Generally, the etching speeds (etch rates) of the data line metal layer 170 and the semiconductive oxide layer 150 in response to the combined $SF_6/O_2$ and $Cl_2/O_2$ etch recipe are different. For example, when the data line metal layer 170 includes Mo, and when the semiconductive oxide layer 150 includes XIZO (X is hafnium, I is indium, Z is zinc, and O is oxygen) and $SF_6/O_2$ is used, the ratio between the etching speed of the data line metal layer 170 and the etching speed of the semiconductor layer 150 is about 70:1, and if $Cl_2/O_2$ is instead used, the ratio between the respective etching speeds of the data line metal layer 170 and the semiconductive oxide layer 150 is about 27:1. When the semiconductor layer 150 includes GIZO (G is gallium, I is indium, Z is zinc, and O is oxygen), a similar result to the case of XIZO may appear.

Figure 6:
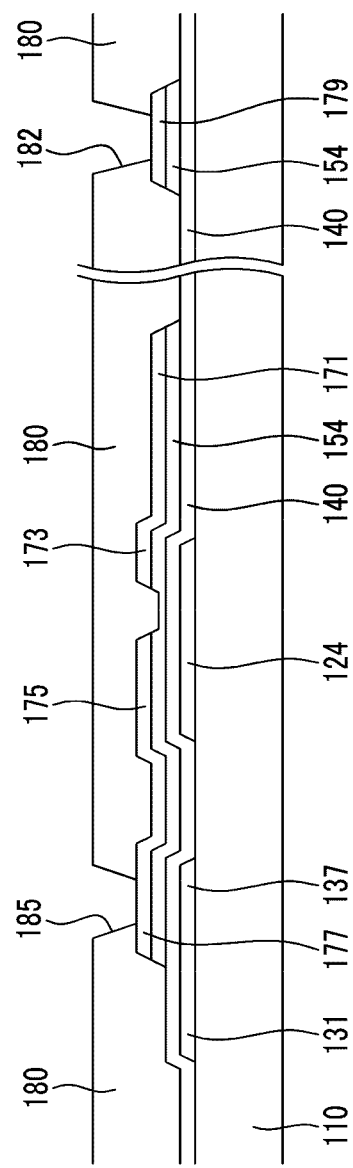

Referring to FIG. 6, a passivation layer 180 including contact holes 182 and 185 is formed on the data line 171 (and 179), the source electrode 173, and the drain electrode 175.

Next, a liquid crystal display according to another exemplary embodiment of the present disclosure will be described with reference to FIG. 7. However, overlapping description with the thin film transistor array panel shown in FIG. 1 to FIG. 2 is omitted.

Figure 7:
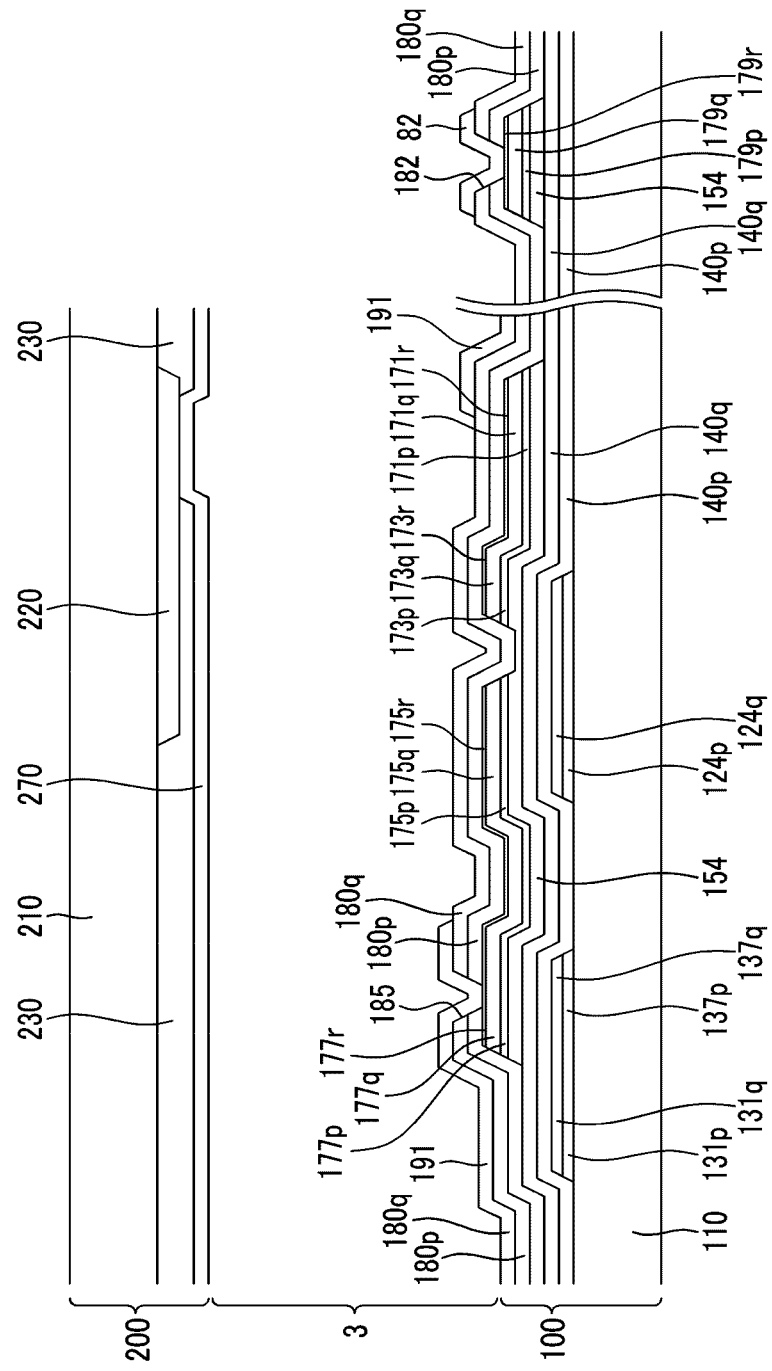
FIG. 7 is a cross-sectional view of a liquid crystal display according to another exemplary embodiment of the present disclosure.

FIG. 7 is a cross-sectional view of a liquid crystal display according to another exemplary embodiment of the present disclosure.

Each of the illustrated gate electrode (124p and 124q), storage electrode line (131p and 131q), and storage electrode (137p and 137q) includes a multi-layered conductive structure. That is, the gate metal layers of the multi-layered structure are deposited on the substrate, and then etched through a photolithography process to pattern the gate metal layers. For example, the lower layer of the gate metal layer may include Ti, and the upper layer thereof may include Cu.

A multi-layered gate insulating layer of two layers (140p and 140q) is formed on the gate electrode (124p and 124q), on the storage electrode line (131p and 131q), and on the storage electrode (137p and 137q). For example, the lower insulating sub-layer may include SiNx, and the upper sub-layer may include SiOx. It may be preferable that the portion close to the semiconductive oxide in the multi-layered gate insulating layer includes an oxide to prevent the characteristic degradation of the channel region. Alternatively, the gate insulating layer may consist of a single layer of SiON, and in this case, the oxygen concentration of the upper portion may be higher than that of the lower portion. Alternatively, an upper sub-layer of the gate insulating layer may include SiOx where oxygen concentration approaches that of $SiO_2$ or greater near its upper surface, and the lower layer thereof may include SiON.

A semiconductive oxide layer 154 is formed on the multi-layered gate insulating layer (140p and 140q). For example, the semiconductive oxide layer 154 may include XIZO.

A multi-layered data line (171p, 171q, 171r, 179p, 179q, and 179r), a multi-layered source electrode (173p, 173q, and 173r), and a multi-layered drain electrode (175p, 175q, 175q, 177p, 177q, and 177r) each including three layers are formed on the semiconductive oxide layer 154. For example, the three layers may define a sandwich for example respectively of the form Mo, Al, and Mo. Also, the data line, the source electrode, and the drain electrode may include two layers of Ti/Cu or CuMn/Cu.

A multi-layered passivation layer of two layers (180p and 180q) is formed on the data line (171p, 171q, 171r, 179p, 179q, and 179r), on the source electrode (173p, 173q, and 173r), and on the drain electrode (175p, 175q, 175q, 177p, 177q, and 177r). For example, the lower sub-layer thereof may include SiOx, and the upper sub-layer thereof may include SiNx. It may be preferable that the portion close to the semiconductive oxide in the passivation layer includes an oxide with heavy oxygen concentration (e.g., SiO2) to thereby prevent characteristic degradation of the channel region. Also, in an alternate embodiment, the passivation layer may essentially consist of a single layer of SiON, and in this case, the oxygen concentration of the lower portion (the one that interfaces with the semiconductive oxide layer) may be higher than that of the upper surface portion. The lower layer thereof may include SiOx, and the upper layer thereof may include SiON.

Next, a liquid crystal display according to another exemplary embodiment of the present disclosure will be described with reference to FIG. 8. However, overlapping description with the thin film transistor array panel shown in FIG. 1 to FIG. 2 is omitted.

Figure 8:
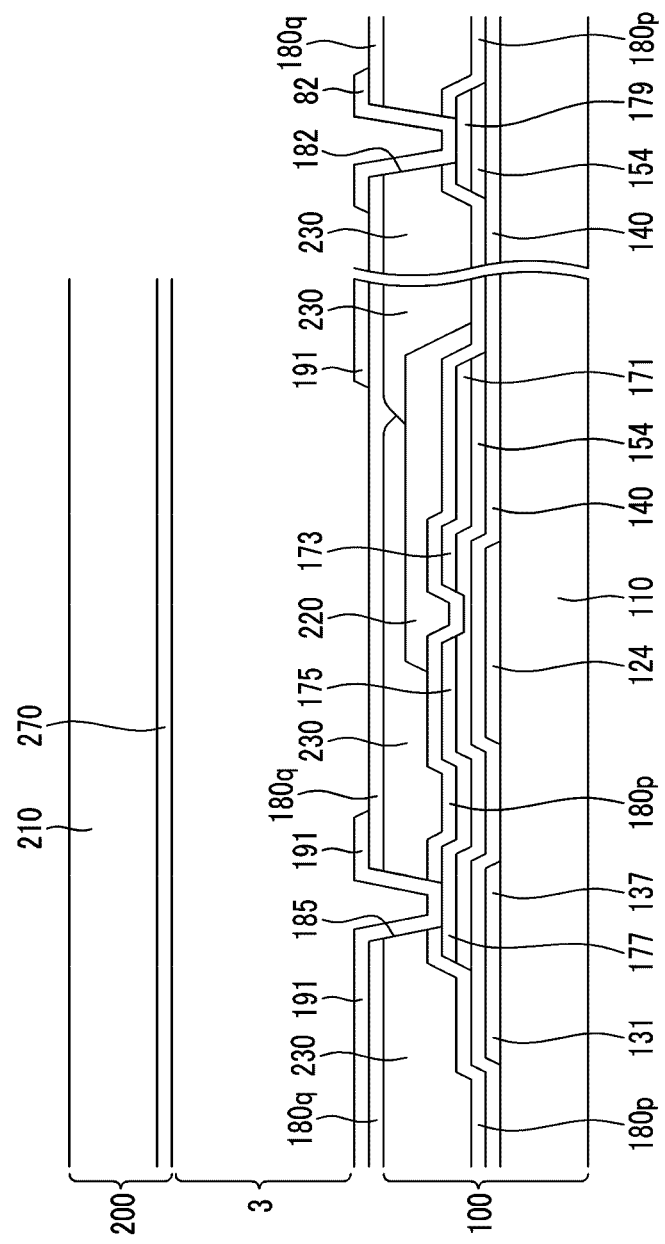
FIG. 8 is a cross-sectional view of a liquid crystal display according to another exemplary embodiment of the present disclosure.

FIG. 8 is a cross-sectional view of a liquid crystal display according to another exemplary embodiment of the present disclosure.

Here, a light blocking member 220 and a color filter 320 are not disposed in the second display panel 200, but are instead positioned in the first display panel 100. That is, the light blocking member 220 is positioned on a lower layer 180p, the color filter 230 is positioned on the light blocking member 220, and the upper layer 180q is positioned on the color filter 230.

Also, one of the light blocking member 220 and the color filter 230 may be positioned in the first display panel 100, and the other may be positioned in the second display panel 200.

Next, the present disclosure will be described through exemplary embodiments in detail, however the exemplary embodiments are only an exemplary embodiment of the present disclosure, and the present teachings are not limited by the exemplary embodiments below.

Characteristics Measuring of the Formed Thin Film Transistors

Figure 9:
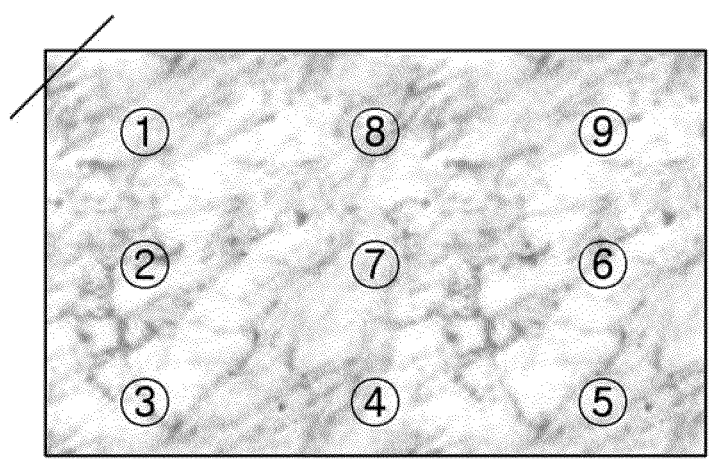
FIG. 9 is a top plan micrographic view of a portion of a semiconductive oxide layer of a thin film transistor and showing granular structures of the semiconductive oxide layer.

A thin film transistor array panel was manufactured by using an semiconductive oxide including XIZO with a thickness of about 400 angstroms and a data line metal including MO with a thickness of about 3000 angstroms. FIG. 9 is a plane view micrograph showing a granular portion of the semiconductive oxide layer of the fabricated thin film transistor, and it shows nine measurement sampling positions used for obtaining a relationship between the drain current ($I_{DS}$) and the gate voltage ($V_{GS}$) of the thin film transistor in positions of numbers 1 to 9. The purpose was to demonstrate that the $I_{DS}$ versus $V_{GS}$ characteristics remain substantially unchanged despite changes in surface granularity.

Figure 10:
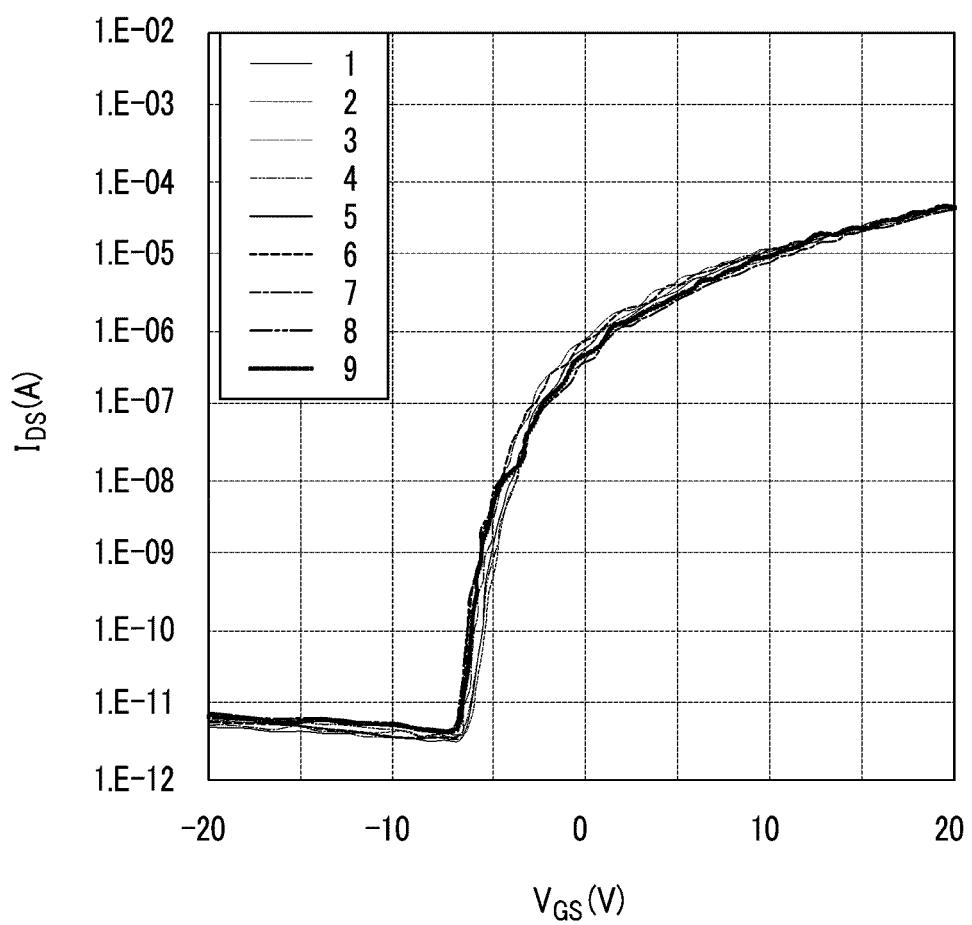
FIG. 10 to FIG. 12 are graphs showing relationships between corresponding currents ($I_{DS}$) and gate voltages ($V_{GS}$) of thin film transistors fabricated according to different process conditions.
Figure 11:
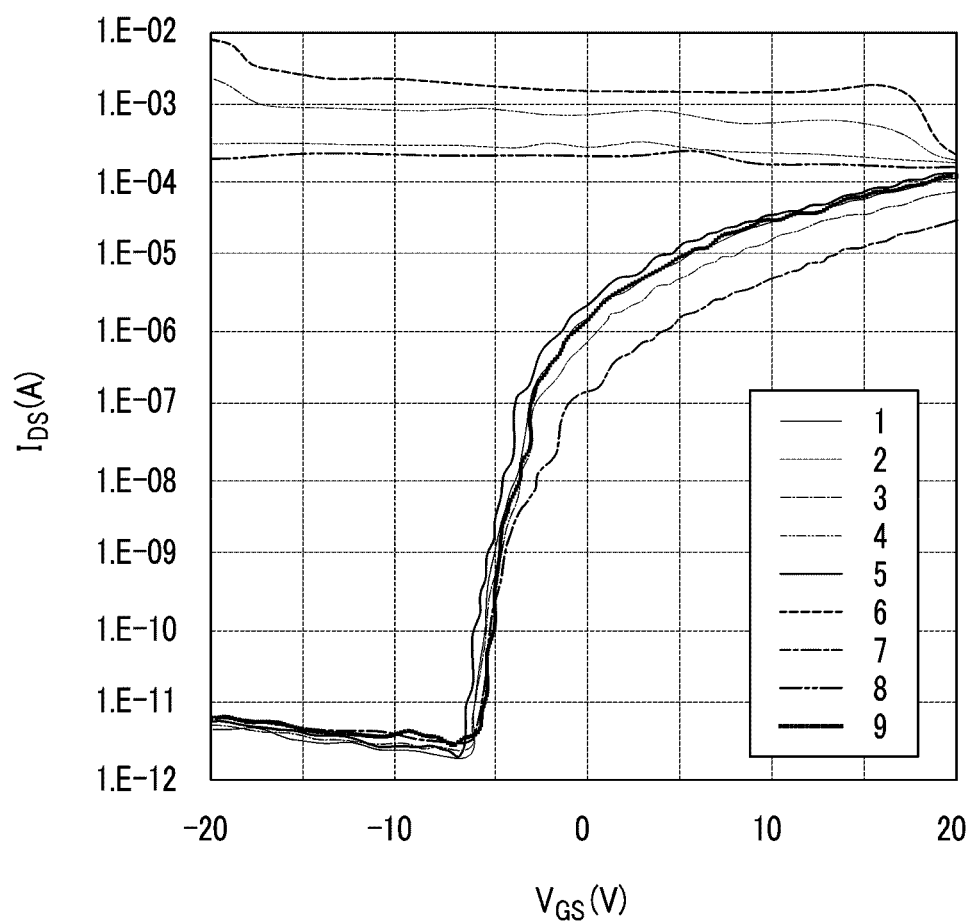

FIG. 10 is a graph showing an observed relationship between the current and the voltage of a thin film transistor according to FIG. 9 as manufactured through a dry etching process using $Cl_2/O_2$ for about 30 seconds. FIG. 11 is a graph showing a relationship between the current and the voltage of another thin film transistor manufactured through a dry etching process using $SF_6/O_2$ for about 30 seconds.

FIG. 10 demonstrates the uniform characteristic of the thin film transistor despite apparent changes of granularity in the utilized surface portion of the manufactured semiconductive oxide layer when the $Cl_2/O_2$ etch recipe was used. However, by contrast, when the $SF_6/O_2$ fetch recipe was used for the TFT measured in FIG. 11 is clear that the latter TFT does not show the uniform characteristic of the thin film transistor of FIG. 10 where the $I_{DS}$ versus $V_{GS}$ characteristics of the channel region where measured using several differently granulated positions in accordance with FIG. 9.

Figure 12:
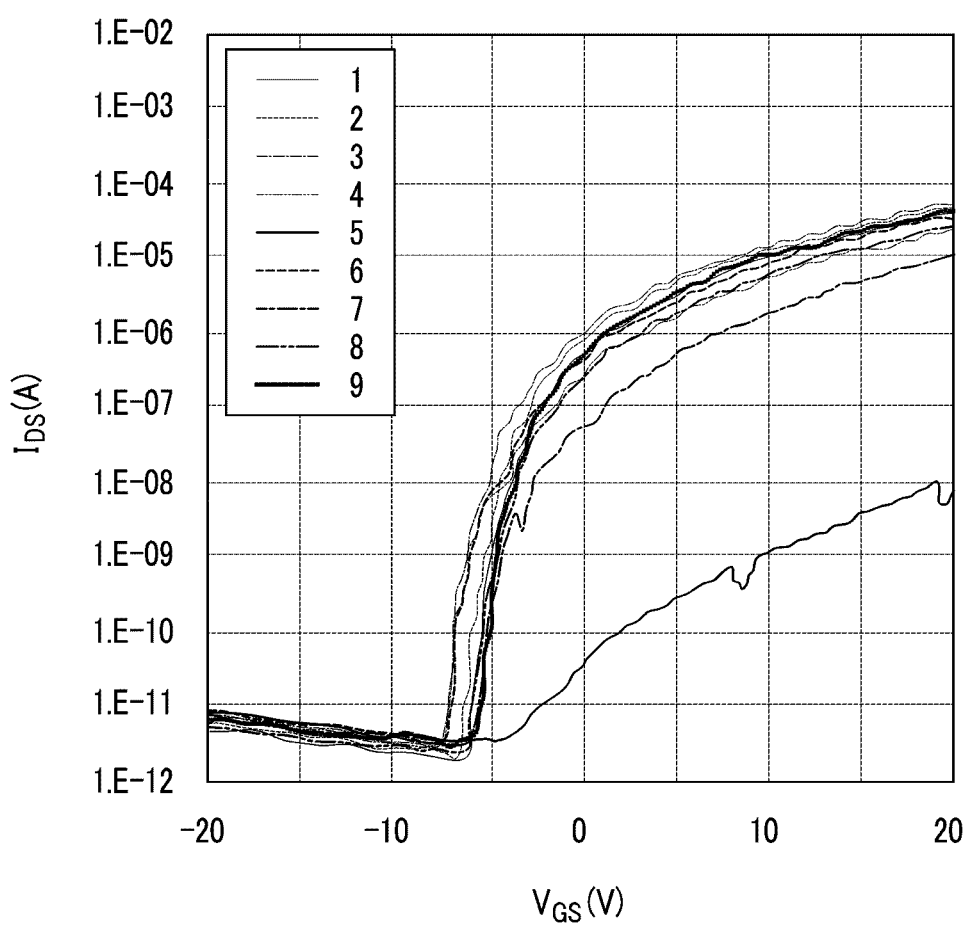

FIG. 12 is a graph showing a relationship between the current and the voltage of a thin film transistor manufactured through over-etching of a semiconductive oxide using a $Cl_2/O_2$ etch recipe for about 45 seconds. The etching step before the over-etching and the first over-etching were executed as one continuous step using $SF_6/O_2$ for about 140 seconds. Next, the second over-etching using $Cl_2/O_2$ for about 45 seconds was performed such that the XIZO layer was etched to a thickness of about 75 angstroms. Here, the thickness of the remaining semiconductive oxide is in the range of about 275-325 angstroms, and it may be confirmed from FIG. 12 that the thin film transistor characteristics are not as uniform in FIG. 12 as they are in FIG. 10; where this tends to demonstrate that it is the etching using $Cl_2/O_2$ that is responsible for giving the upper surface of the semiconductive oxide layer its uniform characteristics even in the face of apparently changing surface granularities.

Atomic Analyzing of an Semiconductive Oxide

A XIZO layer was formed on a substrate. Next, after etching the XIZO using $Cl_2/O_2$ or $SF_6/O_2$ for about 60 seconds, the content ratio of atoms according to depth was measured by atomic concentration analysis after extracting samples of the etch-treated XIZO using sputtering for example to a thickness depth of about 20 nm from the surface. Depth may be understood to be correlated to sputter time.

Figure 13:
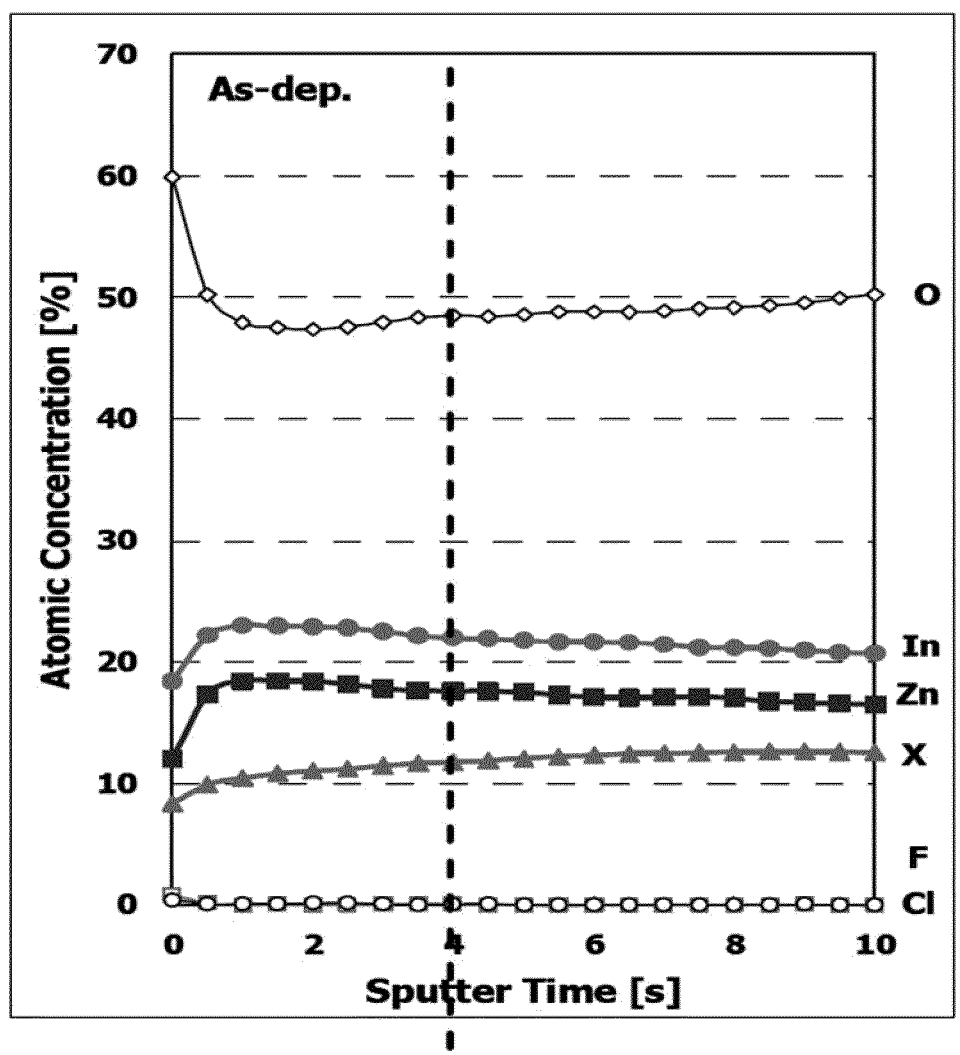
FIG. 13 to FIG. 15 are graphs showing an atomic concentration according to a depth of a semiconductive oxide fabricated according to different process conditions.

FIG. 13 shows the measured atomic concentration according to depth of the XIZO after forming the XIZO on the substrate but without etching the XIZO. FIG. 14 shows atomic concentration according to depth of the XIZO in the case that the XIZO formed on the substrate was treated only using $Cl_2/O_2$ for about 60 seconds. FIG. 15 shows atomic concentration according to depth of the XIZO in the case that the XIZO formed on the substrate was treated only using $SF_6/O_2$ for about 60 seconds. Thus by comparing atomic concentrations versus sputter time in FIGS. 13-15, it may be seen how sub-surface concentrations of various elements changed as a result of treatment with $Cl_2/O_2$ for about 60 seconds (FIG. 14) and as a result of treatment with $SF_6/O_2$ for about 60 seconds (FIG. 15).

More specifically, the sputter times of FIG. 13 to FIG. 15 correspond to positions of depth and depth is about 8 nm from the surface of the XIZO when sputter time is about 4 seconds. Comparing FIG. 13 and FIG. 15, FIG. 15 shows that F atoms of a considerable concentration were undesirably incorporated into the XIZO as a result of the treatment with $SF_6/O_2$. Comparing FIG. 13 and FIG. 14, FIG. 14 shows that Cl atoms of a relatively small amount were incorporated into the XIZO sub-surface as a result of the treatment with $Cl_2/O_2$.

Also, near the surface of the semiconductive oxide layer 154, the content ratio of X in FIG. 14 is relatively larger than the content ratio of X in FIG. 13 and in FIG. 15. Also, the relative content ratio of In or Zn in FIG. 14 is smaller than the content ratio of In or Zn in FIG. 13 and FIG. 15. It is believed (without wishing to be bound to this theory) that the reason for this is that zinc or indium of the semiconductive oxide layer 154 reacted with and combined with the Cl atoms of the etch plasma so as to form volatilized etch byproducts of the type of InClx or ZnClx when dry-etching the semiconductive oxide layer 154 using $Cl_2/O_2$. On the other hand, because it is believed that the X has a stronger chemical bond with oxygen atoms in the semiconductive oxide layer, the X atoms where generally not reacted and volatilized.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the here provided teachings.

What is claimed is:

1. A method for manufacturing a thin film transistor array panel, comprising:
   forming a gate line having a gate electrode extending therefrom on a light passing substrate;
   forming a gate insulating layer, a semiconductive oxide layer, a data line metal layer, and a patterned photoresist film on the gate line having the gate electrode; and
   etching the data line metal layer and the semiconductive oxide layer to form a source electrode and a drain electrode spaced apart by a channel region formed between the source electrode and the drain electrode,
   wherein the etching the data line metal layer on the channel region uses fluorine containing gas, and
   wherein the etching the semiconductive oxide layer on the channel region uses chlorine containing gas.

2. The method of claim 1,
   wherein the fluorine containing gas is SF6/O2, and
   wherein the chlorine containing gas is Cl2/O2.

3. The method of claim 2, wherein the forming a semiconductive oxide layer comprises forming a GIZO layer or a XIZO layer.

4. The method of claim 3, wherein the etching the semiconductive oxide layer comprises etching the semiconductive oxide layer less than about 150 angstroms.

5. The method of claim 2, wherein the etching the semiconductive oxide layer comprises etching the semiconductive oxide layer less than about 150 angstroms.

6. The method of claim 1, wherein the forming a data line metal layer comprises using at least one of Mo, Al, Cu, Ti, Mn, or respective alloys thereof.

7. The method of claim 1, wherein the forming a semiconductive oxide layer comprises forming a GIZO layer or a XIZO layer.

8. The method of claim 7, wherein the etching the semiconductive oxide layer comprises etching the semiconductive oxide layer less than about 150 angstroms.

9. The method of claim 7, wherein the data line metal layer comprises at least one of Mo, Al, Cu, Ti, Mn, and alloys thereof.

10. The method of claim 1, wherein the data line metal layer has a multi-layered conductors structure.

11. The method of claim 1, wherein the gate line and the gate electrode have a double-layered structure.

12. The method of claim 1, wherein the fluorine containing gas is a mixture of SF6/O2 and Cl2/O2, and
wherein the chlorine containing gas is Cl2/O2.

13. The method of claim 12, wherein the forming a semiconductive oxide layer comprises forming a GIZO layer or a XIZO layer.

14. The method of claim 13, wherein the etching the semiconductive oxide layer comprises etching the semiconductive oxide layer less than about 150 angstroms.

15. The method of claim 12, wherein the etching the semiconductive oxide layer comprises etching the semiconductive oxide layer less than about 150 angstroms.

16. The method of claim 1, wherein the etching the data line metal layer comprises:
etching the data line metal layer using a gas including SF6/O2 and Cl2/O2, and
etching the data line metal layer using a gas including a fluorine containing gas.

17. The method of claim 16, wherein the forming a semiconductive oxide layer comprises forming a GIZO layer or a XIZO layer.

18. The method of claim 16, wherein the gas including a fluorine containing gas is SF6/O2.

19. The method of claim 16, wherein the etching the semiconductive oxide layer comprises etching the semiconductive oxide layer less than about 150 angstroms.

20. The method of claim 19, wherein the forming a semiconductive oxide layer comprises forming a GIZO layer or a XIZO layer.

* * * * *